United States Patent
Pang

(10) Patent No.: US 9,103,888 B2
(45) Date of Patent: Aug. 11, 2015

(54) PROTECTION CIRCUIT AND GATE DRIVING CIRCUIT FOR SEMICONDUCTOR SWITCHING DEVICE

(71) Applicant: SAMSUNG ELECTRO-MECHANICS CO., LTD., Suwon, Gyunggi-do (KR)

(72) Inventor: Sung Man Pang, Gyunggi-do (KR)

(73) Assignee: SAMSUNG ELECTRO-MECHANICS CO., LTD., Suwon, Gyunggi-Do ( * ) Notice: Subject to any disclaimer, the term of this patent is extended or adjusted under 35 U.S.C. 154(b) by 208 days.

(21) Appl. No.: 13/794,194

(22) Filed: Mar. 11, 2013

(65) Prior Publication Data

US 2014/0118872 A1      May 1, 2014

(30) Foreign Application Priority Data

Oct. 26, 2012    (KR) .................. 10-2012-0119889

(51) Int. Cl.
| | | |
|---|---|---|
| *H02H 3/08* | (2006.01) | |
| *G01R 31/327* | (2006.01) | |
| *H02H 3/087* | (2006.01) | |
| *G01R 19/165* | (2006.01) | |

(52) U.S. Cl.
CPC ........ *G01R 31/327* (2013.01); *G01R 19/16571* (2013.01); *H02H 3/087* (2013.01); *G01R 19/16519* (2013.01); *G01R 31/3277* (2013.01)

(58) Field of Classification Search
CPC ... H02H 3/08; H02H 3/087; G01R 19/16415; G01R 19/16571; G01R 31/327; G01R 31/3277
USPC .......................................... 361/87
See application file for complete search history.

(56) References Cited

U.S. PATENT DOCUMENTS 8,331,072 B1*   12/2012   Liu et al. ...................... 361/93.9
2011/0133711 A1*   6/2011   Murakami et al. ............ 323/282

FOREIGN PATENT DOCUMENTS

| JP | 2009-021071 | 1/2009 |
|---|---|---|
| KR | 1994-18149 U | 7/1994 |

(Continued)

OTHER PUBLICATIONS

Machine translation of Lee Korean Patent Laid-Open Publication No. 10-2000-0001632, Jan. 15, 2000.*

(Continued)

*Primary Examiner* — Thienvu Tran
*Assistant Examiner* — Kevin J Comber
(74) *Attorney, Agent, or Firm* — McDermott Will & Emery LLP

(57) ABSTRACT

There are provided a protection circuit and a gate driving circuit for a semiconductor switching device. The protection circuit for a semiconductor switching device includes an overcurrent determining unit operated according to a gate signal to determine whether a load current flowing through the semiconductor switching device controlling the load current is an overcurrent, a load open determining unit determining whether a load is open, on the basis of a detection value from a current detection unit detecting the load current, and an error detection unit generating a fault signal when it is determined that the overcurrent flows and the load is open, while the gate signal is in a turned on level of the semiconductor switching device.

14 Claims, 5 Drawing Sheets

(56) References Cited

FOREIGN PATENT DOCUMENTS

| KR | 10-2000-0001632 A | 1/2000 |
|---|---|---|
| KR | 2009-0080736 | 7/2009 |

OTHER PUBLICATIONS

Korean Office Action issued in corresponding Korean Application No. 10-2012-0119889, dated May 22, 2014, with English translation.

* cited by examiner

PROTECTION CIRCUIT AND GATE DRIVING CIRCUIT FOR SEMICONDUCTOR SWITCHING DEVICE

CROSS-REFERENCE TO RELATED APPLICATIONS

This application claims the priority of Korean Patent Application No. 10-2012-0119889 filed on Oct. 26, 2012, in the Korean Intellectual Property Office, the disclosure of which is incorporated herein by reference.

BACKGROUND OF THE INVENTION

1. Field of the Invention

The present invention relates to a protection circuit and a gate driving circuit for a semiconductor switching device, capable of performing an overcurrent protection function and a load open sensing function during driving of the semiconductor switching device, in a semiconductor power switch circuit.

2. Description of the Related Art

In general, a semiconductor power switch circuit may include a plurality of semiconductor switching devices for providing a driving signal to a load such as a motor, or the like. In this case, the semiconductor switch may be configured of a high side switching device and a low side switching device. The switching device may be configured of an IGBT or a MOSFET.

The gate driving circuit is required to drive the semiconductor power switch circuit and the gate driving circuit receives an input signal to generate a gate signal having a level capable of operating a switching device.

However, since an overcurrent higher than a rated current may flow in a switching device, the semiconductor power switch circuit may require a protection function against overcurrent so as to prevent damage to a device due to overcurrent.

Further, when a load is open, a detection signal is in a low state, such that the semiconductor power switch circuit may be erroneously operated to continuously drive the switching device. Therefore, in order to prevent this, the semiconductor power switch circuit requires a load open sensing function.

The following related art document relates to an apparatus for detecting disconnection and/or overcurrent of load circuit and discloses a technology of performing an overcurrent protection function, but does not disclose a technology of simultaneously performing an overcurrent protection function and a load open sensing function during the driving of a semiconductor switching device.

RELATED ART DOCUMENT

Japanese Patent Laid-Open Publication No. 2009-21071

SUMMARY OF THE INVENTION

An aspect of the present invention provides a protection circuit and a gate driving circuit for a semiconductor switching device capable of performing an overcurrent protection function and a load open sensing function during driving of the semiconductor switching device.

According to an aspect of the present invention, there is provided a protection circuit for a semiconductor switching device, including: an overcurrent determining unit operated according to a gate signal to determine whether a load current flowing through the semiconductor switching device controlling the load current is an overcurrent; a load open determining unit determining whether a load is open, on the basis of a detection value from a current detection unit detecting the load current; and an error detection unit generating a fault signal when it is determined that the overcurrent flows and the load is open, while the gate signal is in a turned on level of the semiconductor switching device.

According to another aspect of the present invention, there is provided a gate driving circuit for a semiconductor switching device, including: a gate signal generation unit providing a gate signal to the semiconductor switching device for controlling a load current; an overcurrent determining unit determining whether the load current flowing through the semiconductor switching device is overcurrent; a load open determining unit determining whether a load is open, on the basis of a detection value from a current detection unit detecting the load current; an error detection unit generating a fault signal when it is determined that the overcurrent flows and the load is open, while the gate signal is in a turned on level of the semiconductor switching device; and a protection control unit stopping an operation of the gate driving unit according to the fault signal.

The overcurrent determining unit may compare the detection value from the current detection unit with a preset overcurrent reference value to determine that the overcurrent is present when the detection value is equal to or higher than the overcurrent reference value.

The overcurrent determining unit may include a first comparator having a non-inversion input terminal receiving the detection value from the current detection unit, an inversion input terminal receiving the preset overcurrent reference value, and an output terminal comparing the detection value with the overcurrent reference value to provide an overcurrent determination signal according to the compared results.

The load open determining unit may compare the detection value from the current detection unit with a preset load open reference value to determine that the load is open when the detection value is equal to or lower than the load open reference value.

The load open determining unit may include a second comparator having an inversion input terminal receiving the detection value from the current detection unit, a non-inversion input terminal receiving the preset load open reference value, and an output terminal comparing the detection value with the load open reference value to provide a load open determination signal according to the compared results.

The protection circuit or the gate driving circuit for a semiconductor switching device may further include a level shifter shifting a level of the gate signal and providing the level-shifted gate signal to the error detection unit.

The protection circuit or the gate driving circuit for a semiconductor switching device may further include: a first filter unit installed between the level shifter and the error detection unit to remove noise included in a signal from the level shifter; a second filter unit installed between the overcurrent determining unit and the error detection unit to remove noise included in a signal from the overcurrent determining unit; and a third filter unit installed between the load open determining unit and the error detection unit to remove noise included in a signal from the load open current determining unit.

The error detection unit may include: a first logic gate performing an AND-operation of a signal from the first filter unit and a signal from the second filter unit; a second logic gate performing an AND-operation of a signal from the first filter unit and a signal from the third filter unit; and a third logic gate performing an OR-operation of an output signal from the first logic gate and an output signal from the second logical gate.

The error detection unit may include: an inverter inverting a signal from the first filter unit; a first switch installed between an output terminal of the second filter unit and a ground to be operated according to the output signal from the inverter; a second switch installed between an output terminal of the third filter unit and the ground to be operated according to the output signal from the inverter; and a logic gate performing an OR-operation of a signal from the output terminal of the second filter unit and a signal from the output terminal of the third filter unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
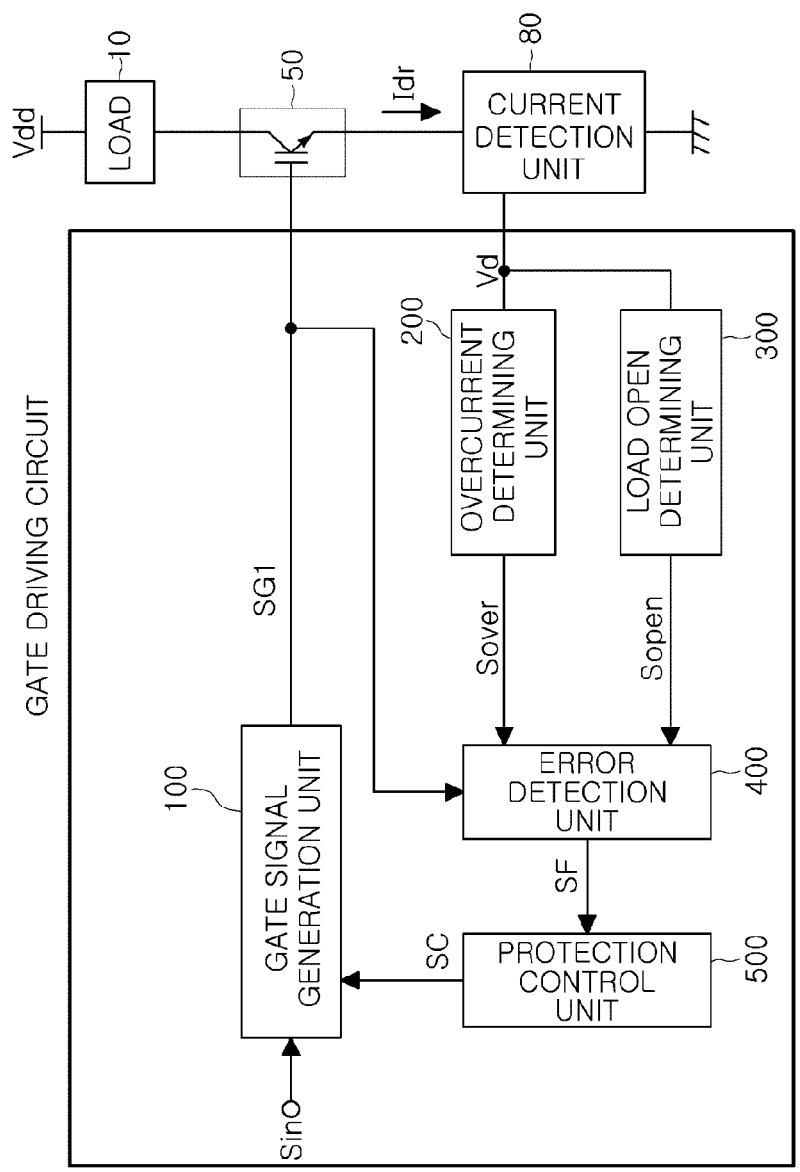
FIG. 1 is a block diagram of a gate driving circuit for a semiconductor switching device according to an embodiment of the present invention.
Figure 2:
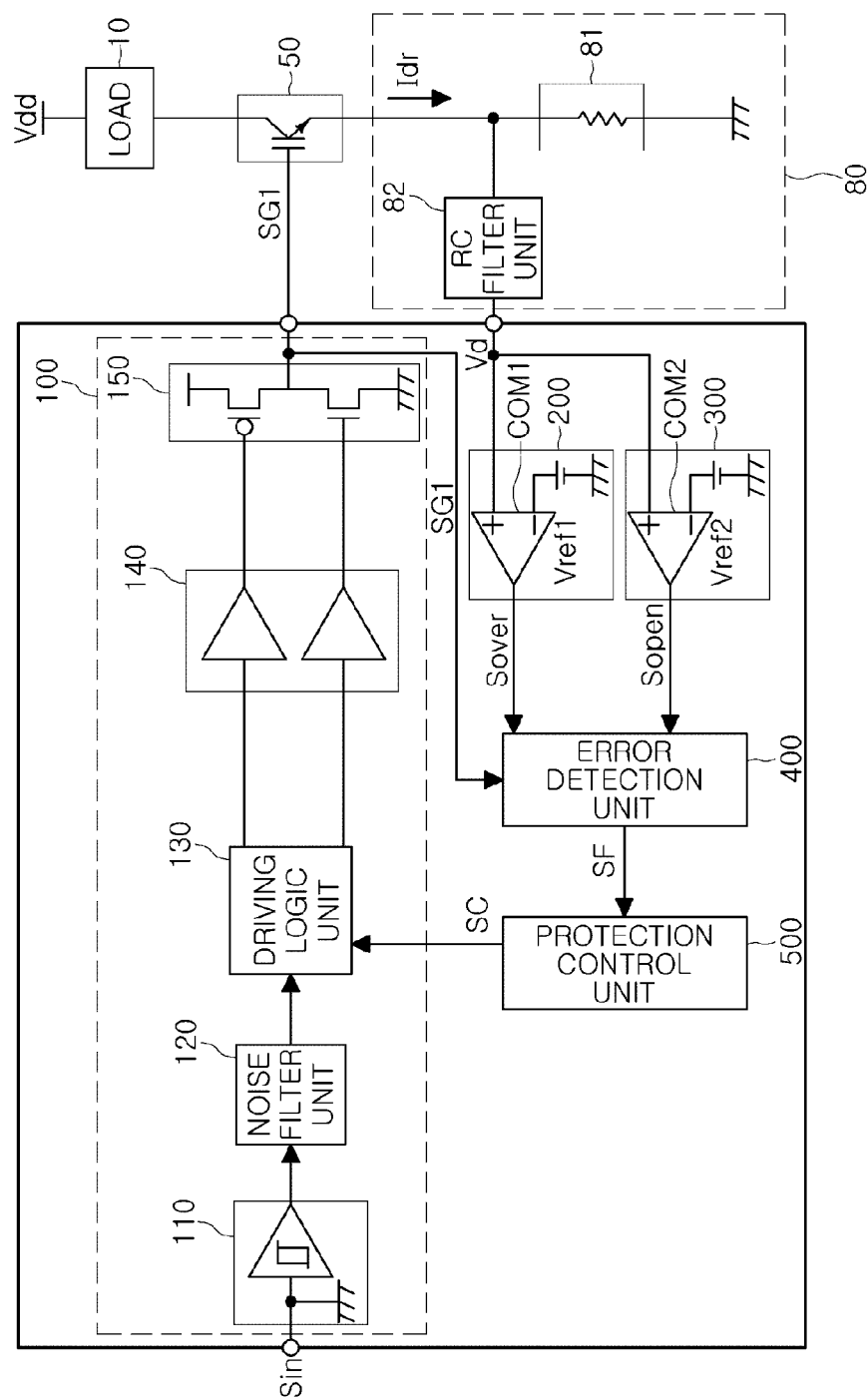
FIG. 2 is a detailed block diagram of the gate driving circuit for the semiconductor switching device according to the embodiment of the present invention.

FIG. 1 is a block diagram of a gate driving circuit for a semiconductor switching device according to an embodiment of the present invention and FIG. 2 is a detailed block diagram of the gate driving circuit for the semiconductor switching device according to the embodiment of the present invention.

Referring to FIGS. 1 and 2, the protection circuit for the semiconductor switching device according to the embodiment of the present invention may include an overcurrent determining unit 200, a load open determining unit 300, an error detection unit 400, and a protection control unit 500 so as to protect a semiconductor switching device 50 for controlling a load current Idr flowing in a load 10 connected between a power supply terminal Vdd and a ground.

Further, a gate driving circuit for the semiconductor switching device according to the embodiment of the present invention may include a gate signal generation unit 100, an overcurrent determining unit 200, a load open determining unit 300, an error detection unit 400, and a protection control unit 500 so as to drive the semiconductor switching device 50.

In this configuration, the semiconductor switching device 50 may be configured of an IGBT or a MOSFET.

The gate signal generation unit 100 may provide a gate signal SG1 to a semiconductor switching device 50 for controlling a load current of the load 10.

In this case, the gate signal generation unit 100 may shift a level of an input signal Sin to a level suitable to drive the semiconductor switching device 50 to generate the gate signal SG1 with the turned on period controlled according to the control signal SC from the protection control unit 500.

The overcurrent determining unit 200 may determine whether the overcurrent is present, based on a detection value Vd from a current detection unit 80 detecting the load current Idr flowing through the semiconductor switching device 50. When the overcurrent flows in the load 10, the detection value Vd corresponding to the load current Idr is higher than a voltage that is a determination criterion of overcurrent. In this case, the over current determining unit 200 may provide an overcurrent determination signal Sover having a preset specific level (for example, a high level).

Here, the current detection unit 80 may detect the load current Idr as a voltage level, such that the detection value Vd may be a voltage level.

The load open determining unit 300 may determine whether the load is open, based on the detection value Vd from the current detection unit 80. For example, when the load is open, little current flows, and thus the detection value Vd may be substantially 0V. In this case, the load open determining unit 300 may provide a load open determination signal Sopen including a preset specific level (for example, a high level).

The error detection unit 400 may generate a fault signal SF when the gate signal SG1 is determined as the overcurrent or the load open during the turned on level of the semiconductor switching device 50.

As such, the error detection unit 400 determines the overcurrent or the load open only during the turned on level of the semiconductor switching device 50, such that the overcurrent or the load open may be determined only during the driving of the semiconductor switching device 50. Therefore, when the semiconductor switching device 50 is not driven, the determination of the overcurrent or the load open presence is not performed, such that when the semiconductor switching device 50 is not driven, an incorrect determination of the overcurrent or the load open may not be undertaken.

In this case, the fault signal SF may include a preset specific level (for example, high level) when it is determined that the overcurrent flows or the load is open.

Further, the protection control unit 500 may stop an operation of the gate driving unit 100 according to the fault signal SF. That is, the protection control unit 500 may provide a control signal SC including the preset specific level to the gate driving unit 100 according to the fault signal SF to stop the operation of the gate driving unit 100.

Referring to FIGS. 1 and 2, the overcurrent determining unit 200 may compare the detection value Vd from the current detection unit 80 with a preset overcurrent reference value Vref1 to determine that an overcurrent is present, when the detection value Vd is the overcurrent reference value Vref1 or more.

The load open determining unit 300 may compare the detection value Vd from the current detection unit 80 and a preset load open reference value Vref2 to determine that a load is open, when the detection value Vd is the load open current reference value Vref2 or lower.

As one implementation example, the current detection unit 80 may include a sense resistor 81 detecting the load current Idr and an RC filter unit 82 filtering the detection value by the sense resistor 81. The current detection unit 80 may be configured of a circuit detecting current and the embodiment of the present invention is not limited to the implementation example.

As one implementation example, the overcurrent determining unit 200 may include a first comparator COM1, and the first comparator COM1 receives the detection value Vd from the current detection unit 80 through a non-inversion input terminal and receives the preset overcurrent reference value Vref1 through an inversion input terminal to compare the detection value Vd with the overcurrent reference value Vref1 to output an overcurrent determination signal Sover based on the compared results through an output terminal.

In this case, the overcurrent determination signal Sover becomes a high-level signal when the detection value Vd is the overcurrent reference value Vref1 or more and becomes a low-level signal when the detection value Vd is lower than the overcurrent reference value Vref1.

As one implementation example, the load open determining unit 300 may include a second comparator COM2, and the second comparator COM2 receives the detection value Vd from the current detection unit 80 through the inversion input terminal and receives the preset load open reference value Vref2 through the non-inversion input terminal, to compare the detection value Vd with the load open reference value Vref2 and output the load open determination signal Sopen based on the compared results through the output terminal.

In this case, the load open determination signal Sopen becomes a high level signal when the detection value Vd is lower than the load open reference value Vref2 and becomes a low level signal when the detection value Vd is the load open reference value Vref2 or more.

Meanwhile, the gate signal generation unit 100 may include a comparison unit 110, a noise filter 120, a driving logic unit 130, an amplification unit 140, and a switching circuit unit 150 as one implementation example. The gate signal generation unit 100 may be configured of a circuit generating a gate signal and the embodiment of the present invention is not limited to the implementation example.

The comparison unit 110 may compare the input signal Sin with the preset value to output the high-level signal and the low-level signal.

The noise filter 120 may remove noise included in the signal provided from the comparison unit 110.

The driving logic unit 130 may generate a signal with the turned on period controlled according to the control signal SC from the protection control unit 500, in response to the signal from the noise filter 120.

The amplification unit 140 may amplify the signal from the driving logic unit 130 to the preset gain.

In addition, the switching circuit unit 150 may include two switches having a stack structure to alternately perform the switching with each other according to the signal from the amplification unit 140 to generate the gate signal SG1 having a level suitable to drive the semiconductor switching device 50.

Figure 3:
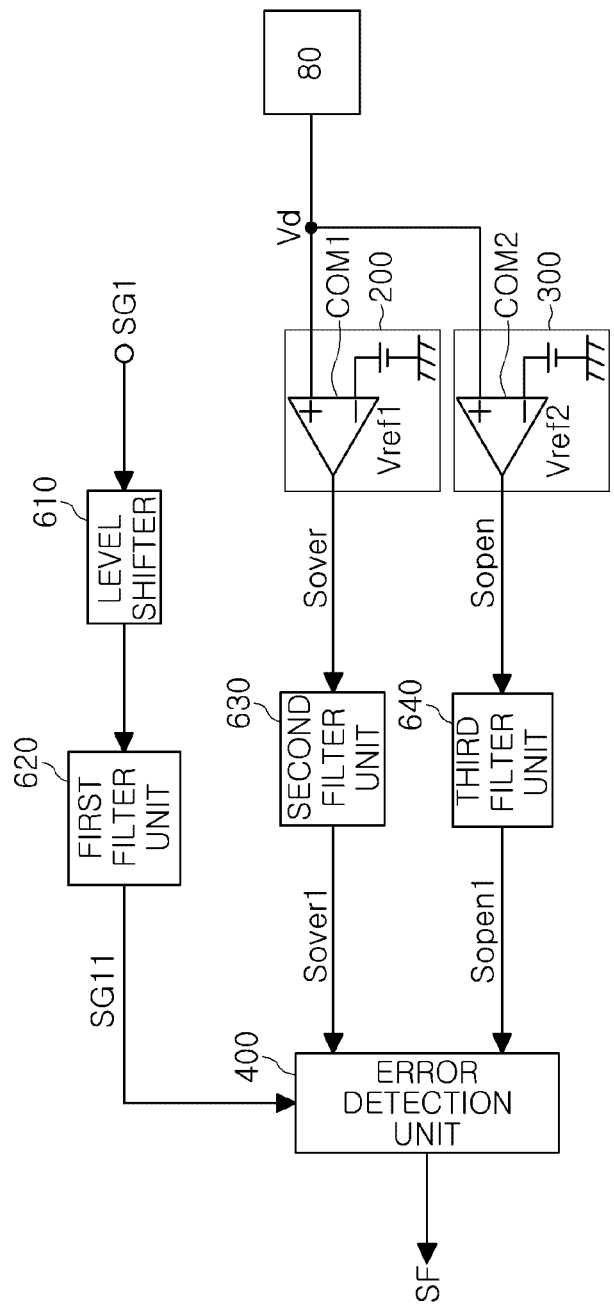
FIG. 3 is a block diagram of a level shifter and first, second, and third filter units according to an embodiment of the present invention.

FIG. 3 is a block diagram of a level shifter and first, second, and third filter units according to the embodiment of the present invention.

Referring to FIG. 3, the protection circuit and the gate driving circuit for the semiconductor switching device according to the embodiment of the present invention may further include a level shifter 610, a first filter unit 620, a second filter unit 630, and a third filter unit 640.

The level shifter 610 may shift the level of the gate signal SG1 and provide the level-shifted gate signal SG1 to the first filter unit 620.

The first filter unit 620 may be installed between the level shifter 610 and the error detection unit 400 to remove the noise included in the signal from the level shifter 610 and provide a noise-removed gate signal SG11 to the error detection unit 400.

The second filter unit 630 may be installed between the overcurrent determining unit 200 and the error detection unit 400 to remove the noise included in the overcurrent determination signal Sover of the overcurrent determining unit 200 and provide an overcurrent determination signal Sover1 from which noise has been removed, to the error detection unit 400.

Further, the third filter unit 640 may be installed between the load open determining unit 300 and the error detection unit 400 to remove the noise included in the load open determination signal Sopen of the load open current determining unit 300 and provide the noised-removed load open determination signal Sopen1 to the error detection unit 400.

Figure 4:
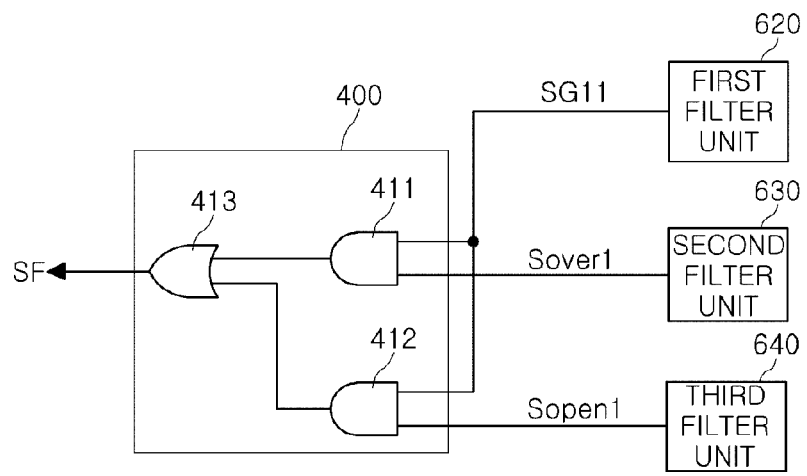
FIG. 4 is a diagram illustrating a first implementation example of an error detection unit according to the embodiment of the present invention.
Figure 5:
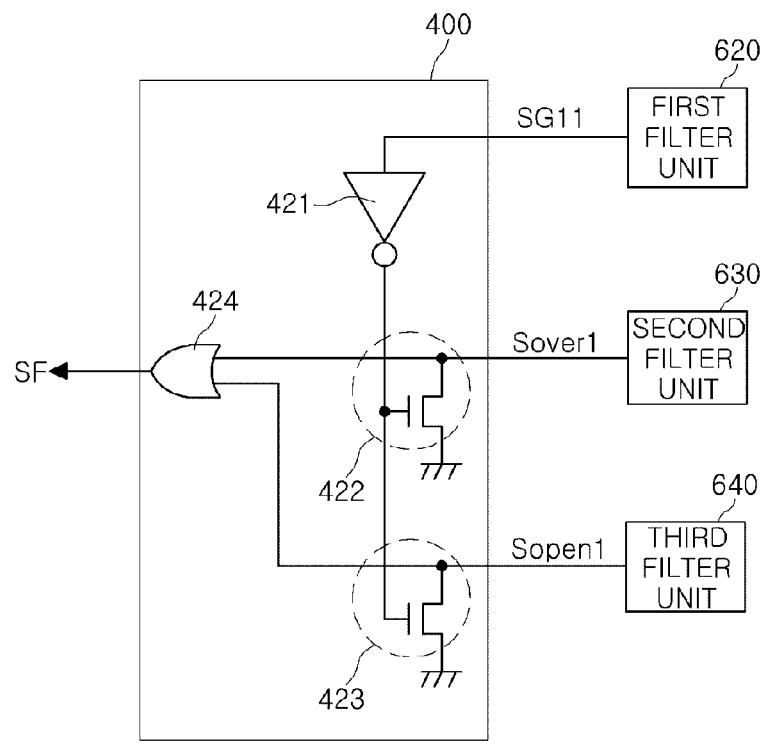
FIG. 5 is a diagram illustrating a second implementation example of an error detection unit according to the embodiment of the present invention.

The implementation example of the error detection unit 400 will be described with reference to FIGS. 4 and 5 and FIGS. 4 and 5 illustrate the implementation example of the error detection unit 400, and the embodiment of the present invention is not limited thereto.

FIG. 4 is a diagram illustrating a first implementation example of the error detection unit according to the embodiment of the present invention.

Referring to FIG. 4, the error detection unit 400 may include a first logic gate 411, a second logic gate 412, and a third logic gate 413.

The first logic gate 411 performs an AND-operation of the gate signal SG11 from the first filter unit 620 and the overcurrent determination signal Sover1 from the second filter unit 630. For example, the first logic gate 411 outputs the high-level signal when the gate signal SG11 has a high level and the overcurrent determination signal Sover1 has a high level.

The second logic gate 412 performs an AND-operation of the signal SG11 from the first filter unit 630 and the signal Sopen1 from the third filter unit 640. For example, the second logic gate 412 outputs the high-level signal when the gate signal SG11 has a high level and the load open determination signal Sopen1 has a high level.

In addition, the third logic gate 413 performs an OR-operation of the output signal from the first logic gate 411 and the output signal from the second logic gate 412. For example, the third logic gate 413 outputs the high-level signal when at least one of the output signal from the first logic gate 411 and the overcurrent determination signal Sover1 has a high level.

FIG. 5 is a diagram illustrating a second implementation example of an error detection unit according to the embodiment of the present invention.

Referring to FIG. 5, the error detection unit 400 may include an inverter 421, a first switch 422, a second switch 423, and a logic gate 424.

The inverter 421 inverts the gate signal SG11 from the first filter unit 620 to provide a level-inverted signal. For example, when the gate signal SG11 has a high level, the inverter 421 inverts the high level into a low level, and when the gate signal SG11 has a low level, the inverter 421 inverts the low level into the high level.

The first switch 422 is installed between the output terminal of the second filter unit 630 and a ground and is operated according to an output signal from the inverter 421. The second switch 423 is installed between the output terminal of the third filter unit 640 and the ground and is operated according to the output signal from the inverter 421. For example, when the gate signal SG11 has a high level, the first and second switches 422 and 423 are in a turned on state, and thus the output terminals of the second and third filter units 630 and 640, respectively, are connected to the ground by the first and second switches 422 and 423. Differently from this, when the gate signal SG11 has a low level, the first and second switches 422 and 423 are in a turned off state.

In addition, the logic gate 424 performs an OR-operation of a signal from the output terminal of the second filter unit 630 and a signal from the output terminal of the third filter unit 640 to provide the fault signal SF. For example, the logic gate 424 may provide the high-level fault signal SF when at least one of the signal from the output terminal of the second filter unit 630 and the signal from the output terminal of the third filter unit 640 has a high level, since the first and second switches 422 and 423 are in a turned off state when the gate signal SG11 has a high level.

Figure 6:
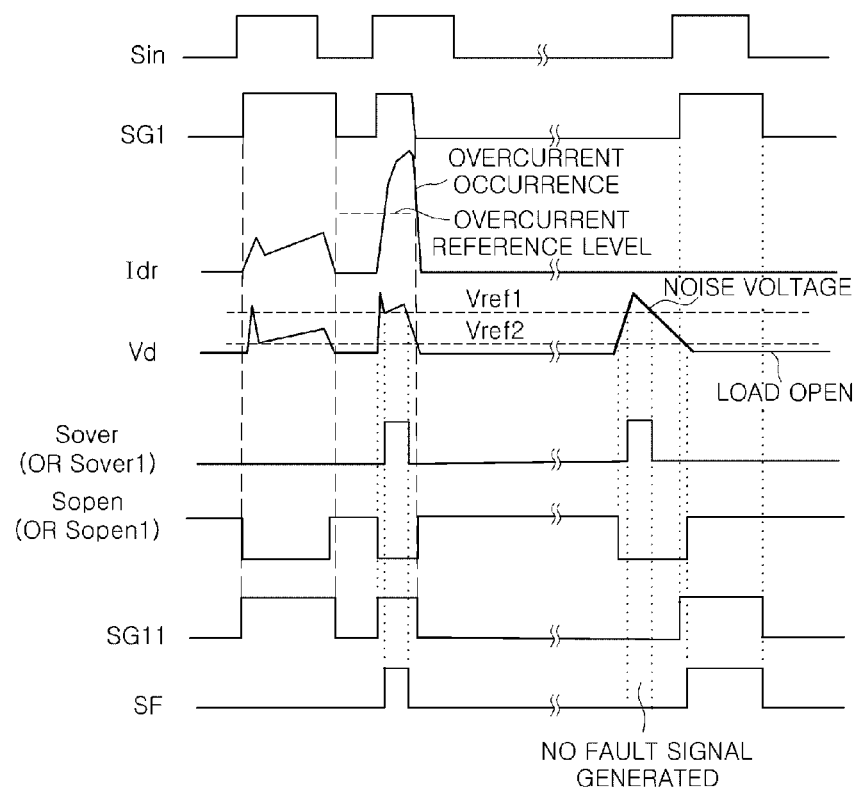
FIG. 6 is a timing charge of a main signal according to an embodiment of the present invention.

FIG. 6 is a timing chart of a main signal according to an embodiment of the present invention.

In FIG. 6, Sin is an input signal input to the gate signal generation unit 100, which is a pulse signal of which the high level and the low level are alternately repeated.

SG1 is a gate signal provided from the gate signal generation unit 100, which is synchronous with the input signal Sin, and the high-level period thereof may be controlled at the time of the occurrence of overcurrent based on the load current Idr.

Idr is load current flowing in the load 10, which flows in synchronization with the gate signal SG1 and corresponds to a target signal detected by the current detection unit 80.

For example, when the overcurrent flows in the load 10 while the gate signal SG1 has a turned on level of the semiconductor switching device 50, the load current Idr will be the overcurrent determination reference value or more, and when the load 10 is open, the load current Idr is set to be a load open reference value or lower.

Vd is a detection value provided from the current detection unit 80 and corresponds to a voltage level (Vd=Idr/R, R is a sense resistor of the current detection unit) that corresponds to the load current Idr.

For example, in case of the normal state, the detection value Vd may have a level between the overcurrent reference value Vref1 and the load open reference value Vref2 when the gate signal SG1 has the turned on level of the semiconductor switching device 50, in case of the overcurrent, the detection value Vd may have the overcurrent reference value Vref1 or more, and in case of the load open, the detection value Vd may have the load open reference value Vref2 or lower.

The Sover (or Sover1) is the overcurrent determination signal Sover provided from the overcurrent determining unit 200 and has a high level at the time of the occurrence of an overcurrent.

The Sopen (or Sopen 1) is the load open determination signal provided from the load open determining unit 300 and has a high level at the time of load open.

The SG11 is synchronous with the gate signal SG1 and is the gate signal provided from the level shifter 610.

The SF is a fault signal provided from the error detection unit 400 and has a high level at the time of the occurrence of overcurrent or the load open.

As set forth above, according to the embodiments of the present invention, the gate driving circuit for the semiconductor switching device may perform the overcurrent protection function and the load open sensing function during the driving of the semiconductor switching device.

Further, according to the embodiments of the present invention, the error of wrongly detecting overcurrent due to a noise may be prevented and it may accurately sense whether the load of the semiconductor switching device is open by determining whether the semiconductor switching device is driven by using the gate signal and detecting the overcurrent or the load open only when the semiconductor switching device is driven.

While the present invention has been shown and described in connection with the embodiments, it will be apparent to those skilled in the art that modifications and variations may be made without departing from the spirit and scope of the invention as defined by the appended claims.

What is claimed is:

1. A protection circuit for a semiconductor switching device, comprising:
   an overcurrent determiner including at least one comparator and operated according to a gate signal to determine whether a load current flowing through the semiconductor switching device controlling the load current is an overcurrent;
   a load open determiner including at least one comparator and determining whether a load is open, on the basis of a detection value from a current detector detecting the load current;
   an error detector including a plurality of logic gates and generating a fault signal when it is determined that the overcurrent flows or the load is open, while the gate signal is in a turned on level of the semiconductor switching device;
   a level shifter shifting a level of the gate signal and providing the level-shifted gate signal to the error detector;
   a first filter installed between the level shifter and the error detector to remove noise included in a signal from the level shifter;
   a second filter installed between the overcurrent determiner and the error detector to remove noise included in a signal from the overcurrent determiner; and
   a third filter installed between the load open determiner and the error detector to remove noise included in a signal from the load open determiner.

2. The protection circuit for a semiconductor switching device of claim 1, wherein the overcurrent determiner compares the detection value from the current detector with a preset overcurrent reference value to determine that the overcurrent is present when the detection value is equal to or higher than the overcurrent reference value.

3. The protection circuit for a semiconductor switching device of claim 1, wherein the overcurrent determiner includes a first comparator having a non-inversion input terminal receiving the detection value from the current detector, an inversion input terminal receiving the preset overcurrent reference value, and an output terminal comparing the detection value with the overcurrent reference value to provide an overcurrent determination signal according to the compared results.

4. The protection circuit for a semiconductor switching device of claim 1, wherein the load open determiner compares the detection value from the current detector with a preset load open reference value to determine that the load is open when the detection value is equal to or lower than the load open reference value.

5. The protection circuit for a semiconductor switching device of claim 1, wherein the load open determiner includes a second comparator having an inversion input terminal receiving the detection value from the current detector, a non-inversion input terminal receiving the preset load open reference value, and an output terminal comparing the detection value with the load open reference value to provide a load open determination signal according to the compared results.

6. The protection circuit for a semiconductor switching device of claim 1, wherein the error detector includes:
   a first logic gate performing an AND-operation of a signal from the first filter and a signal from the second filter;
   a second logic gate performing an AND-operation of a signal from the first filter and a signal from the third filter; and
   a third logic gate performing an OR-operation of an output signal from the first logic gate and an output signal from the second logical gate.

7. The protection circuit for a semiconductor switching device of claim 1, wherein the error detector includes:
   an inverter inverting a signal from the first filter;
   a first switch installed between an output terminal of the second filter and a ground to be operated according to the output signal from the inverter;
   a second switch installed between an output terminal of the third filter and the ground to be operated according to the output signal from the inverter; and
   a logic gate performing an OR-operation of a signal from the output terminal of the second filter and a signal from the output terminal of the third filter.

8. A gate driving circuit for a semiconductor switching device, comprising:
   a gate signal generator providing a gate signal to the semiconductor switching device for controlling a load current;
   an overcurrent determiner including at least one comparator and determining whether the load current flowing through the semiconductor switching device is overcurrent;
   a load open determiner including at least on comparator and determining whether a load is open, on the basis of a detection value from a current detector detecting the load current;
   an error detector including a plurality of logic gates and generating a fault signal when it is determined that the overcurrent flows or the load is open, while the gate signal is in a turned on level of the semiconductor switching device;
   a protection controller stopping an operation of the gate driving circuit according to the fault signal;
   a level shifter shifting a level of the gate signal and providing the level-shifted gate signal to the error detector;
   a first filter installed between the level shifter and the error detector to remove noise included in a signal from the level shifter;
   a second filter installed between the overcurrent determiner and the error detector to remove noise included in a signal from the overcurrent determiner; and
   a third filter installed between the load open determiner and the error detector to remove noise included in a signal from the load open determiner.

9. The gate driving circuit for a semiconductor switching device of claim 8, wherein the overcurrent determiner compares the detection value from the current detector with a preset overcurrent reference value to determine that the overcurrent is present when the detection value is equal to or higher than the overcurrent reference value.

10. The gate driving circuit for a semiconductor switching device of claim 8, wherein the overcurrent determiner includes a first comparator having a non-inversion input terminal receiving the detection value from the current detector, an inversion input terminal receiving the preset overcurrent reference value, and an output terminal comparing the detection value with the overcurrent reference value to provide an overcurrent determination signal according to the compared results.

11. The gate driving circuit for a semiconductor switching device of claim 8, wherein the load open determiner compares the detection value from the current detector with a preset load open reference value to determine that the load is open when the detection value is equal to or lower than the load open reference value.

12. The gate driving circuit for a semiconductor switching device of claim 8, wherein the load open determiner includes a second comparator having an inversion input terminal receiving the detection value from the current detector, a non-inversion input terminal receiving the preset load open reference value, and an output terminal comparing the detection value with the load open reference value to provide a load open determination signal according to the compared results.

13. The gate driving circuit for a semiconductor switching device of claim 8, wherein the error detector includes:
   a first logic gate performing an AND-operation of a signal from the first filter and a signal from the second filter;
   a second logic gate performing an AND-operation of a signal from the first filter and a signal from the third filter; and
   a third logic gate performing an OR-operation of an output signal from the first logic gate and an output signal from the second logical gate.

14. The gate driving circuit for a semiconductor switching device of claim 8, wherein the error detector includes:
   an inverter inverting a signal from the first filter;
   a first switch installed between an output terminal of the second filter and a ground to be operated according to the output signal from the inverter;
   a second switch installed between an output terminal of the third filter and the ground to be operated according to the output signal from the inverter; and
   a logic gate performing an OR-operation of a signal from the output terminal of the second filter and a signal from the output terminal of the third filter.

* * * * *